METHOD FOR PRODUCING PURE POLISHED SURFACES
ON SEMICONDUCTOR BODIES
Filed July 13, 1964

United States Patent Office 3,392,069
Patented July 9, 1968

3,392,069
METHOD FOR PRODUCING PURE POLISHED SURFACES ON SEMICONDUCTOR BODIES

Hans Merkel, Erlangen, and Siegfried Leibenzeder, Erlangen-Buchenbach, Germany, assignors to Siemens Aktiengesellschaft, Munich, Germany, a corporation of Germany Filed July 13, 1964, Ser. No. 382,230
Claims priority, application Germany, July 17, 1963, S 86,211
3 Claims. (Cl. 156—17)

Our invention relates to a method for producing pure surfaces on semiconductor bodies. The method according to our invention constitutes a process of etching a semiconductor surface by means of gas. This method is particularly well suitable for the production of semiconductor components that are obtained by a monocrystalline precipitation from the gaseous phase upon etched substrate crystals.

Many semiconductor components consist of a monocrystalline fundamental body which has several regions of respectively different conductance type or respectively different dopant concentration. An essential prerequisite for the production of technologically useful semiconductor components of this type is the requirement that the substrate crystal, particularly its surface, be pure and completely free of lattice crystal faults. The substrate crystals are obtained, for example, by sawing a monocrystalline semiconductor rod of a desired diameter. Radiochemical investigation has shown that when the semiconductor rod is being sawed, the impurities are pressed relatively deep, namely 30$\mu$ and more, into the crystal. The technique of electronic semiconductor components further requires extremely planar layers upon which pyrolytically precipitated monocrystalline layers can be grown. For that reason, the substrate surfaces are polished to high brilliance. The necessary lapping and polishing operations as well as the sawing operation have the effect that the surface layer of the substrate crystal is greatly damaged and destroyed on account of the high mechanical strain. Such a disturbed and contaminated crystal is completely unsuitable as a substrate.

It has been attempted to eliminate the above-mentioned disturbances by wet etching of the substrate discs. A large number of different etching solutions have been proposed for these purposes, for example mixtures of hydrofluoric acid and nitric acid in various quantitative ratios, potassium lye or sodium lye of different concentrations, and others. Despite numerous attempts toward improving the etching by additions, none of the etching solutions proposed heretofore was fully satisfactory. Most frequently, a non-uniform attack of the etching medium is observed. The discs exhibit etch pits or at least assume a wavy surface. Particularly, the uniform elimination of relatively thick surface layers for the purpose of removing the damaged upper crystal layer, encounters great difficulties. Besides, it is hardly possible to completely eliminate the impurities adhering to the substrate cystal. Furthermore, sufficiently pure etching solutions are not available in practice, so that generally the etched crystal surface is contaminated by the etching process, also by the effect of cementation of impurities from the etching solution upon the crystal. Another disadvantage of the wet etching methods is the fact that it is difficult to eliminate an accurately defined and predetermined thickness of the substrate crystal.

It an object of our invention to obviate the above-mentioned disadvantages of the wet etching methods.

Another object of the invention is to perform the etching process in the pyrolytic crystal growing cell itself shortly prior to performing the growing process.

Still another object of the invention is to eliminate the need for lapping or polishing the substrate discs obtained by slicing a semiconductor rod with the aid of a saw, prior to our etching step.

According to the invention, we pass over the semiconductor body, at a temperature of about 50 to 500° C. below its melting point, a gaseous mixture consisting of hydrogen, halogen hydride and a halogen compound of the semiconductor substance, for a period of one to sixty minutes so that an etching reaction in the sense of a controllable elimination of semiconductor material from the surface of the semiconductor body takes place.

By virtue of the gas etching process according to the invention, the surface layer of the substrate crystal, contaminated, rough and crystallographically disturbed after the sawing operation, is purified and smoothed. It is possible to readily eliminate with complete uniformity a layer of defined and predetermined thickness, so that no difficulties are encountered in completely removing the disturbed or damaged crystal surface layer.

The gas etching method according to the invention is applicable to semiconductor bodies consisting of the semiconducting elements, such as silicon or germanium, as well as to bodies of semiconducting compounds for example of the type $A^{III}B^{V}$. The geometric shape of the substrate is of no significance. For example, rod or other shaped semiconductor bodies can be gas-etched with equally good results.

The method of the invention will be further described with reference to the drawing and with reference to examples. On the drawing.

Figures 1, 2:
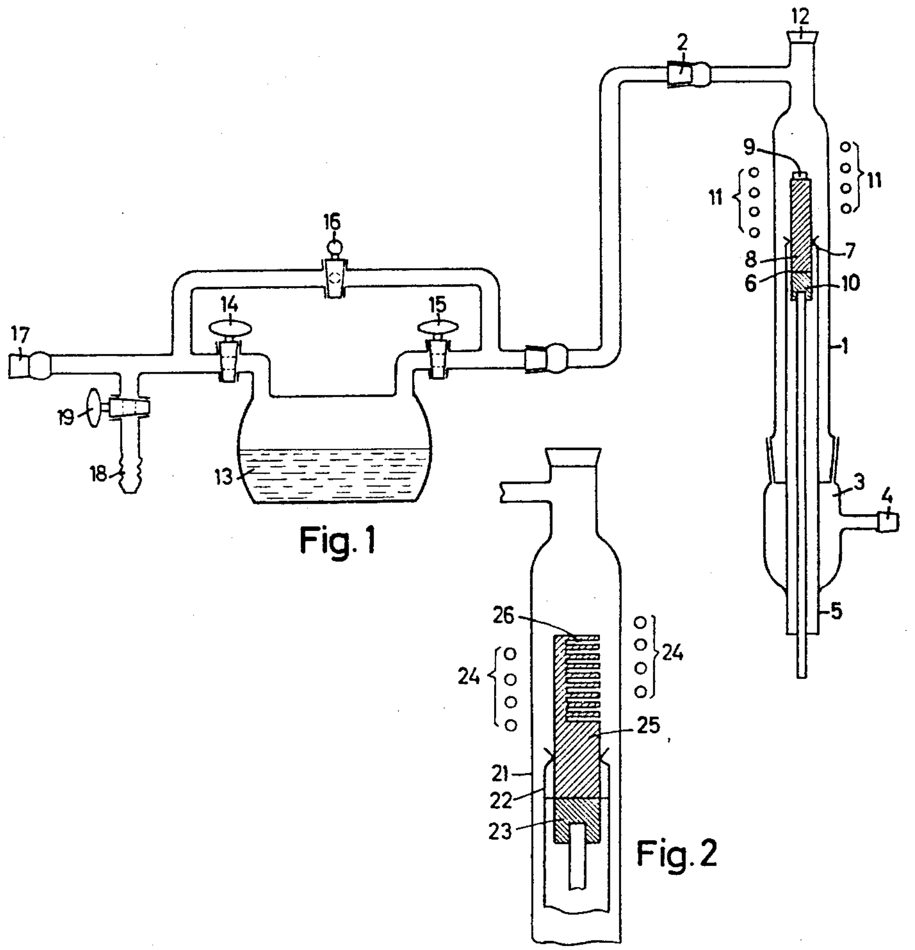
FIG. 1 shows schematically an apparatus for performing the gas etching method according to the invention.
FIG. 2 shows on larger scale an etching cell of modified design applicable in an apparatus otherwise corresponding to FIG. 1.

Shown in FIG. 1 is a quartz tube 1 with a gas inlet 2, a closure cap 3 and a gas outlet 4. The quartz tube 1 and the closure cap 3 constitute the etching cell which can also be used as a crystal growing cell. Mounted coaxially in the tubular vessel 1 and fused thereto is a quartz tube 5, which is closed by a planar plug 6 on which a holder 7 is mounted. The holder 7 serves for receiving a heater rod 8; for example, a rod of silicon. The holder rod has a planar top surface upon which the semiconductor disc 9 to be etched is placed. A graphite plunger 10 is inserted into the inner quartz tube 5. The tubular vessel 1 is surrounded at the height of the heater by a high-frequency coil 11 which is displaceable in the vertical direction. A quartz window is denoted by 12. The inlet 2 communicates with an evaporator 13 for the halogen compound of the semiconductor material. Hydrogen is supplied through an inlet nipple 17, and hydrogen halide is supplied through an inlet nipple 18. The connections also include valves 14, 15, 16 and 19.

The high-frequency coil 11 is first positioned so the graphite plunger 10 and the lower portion of the heater rod are located in the high-frequency field. When current is passed through the coil 11, the graphite plunger is rapidly heated. After the heater rod 8 commences to glow in its lower portion, the high-frequency coil 11 and thereby the heated zone in the rod 8 is moved upwardly to the position shown in FIG. 1. The temperature of the semiconductor disc 9 can be measured pyrometrically through the quartz window 12 and can thus be controlled. The flow rate for each gas is adjusted and observed by means of gas-flow meters (not illustrated).

Example 1

Producing pure surfaces on a silicon substrate crystal, melting temperature 1420° C.

The evaporator 13, filled with silicon tetrachloride, is kept at 0° C. by means of a cooling bath (not shown), and the apparatus is rinsed with hydrogen. The silicon substrate crystal 9 is heated by means of the high-frequency coil 11 to a temperature between 1150 to 1250° C. Thereafter, a gas mixture consisting of 1 mole hydrogen and 0.16 mole hydrogen-chloride gas is passed through the evaporator. This gas mixture entrains 0.04 mole gaseous silicon tetrachloride. The resulting gas mixture constitutes the etching gas which passes into the etching cell to act upon the substrate crystal heated to 1150° C. This etching operation is performed for 3 minutes. A surface layer of 45$\mu$ thickness is eliminated from the substrate crystal. The etched surface is smooth and brilliant. After etching, the entry of hydrogen chloride is stopped by closing the valve 19. The same cell can now be used for growing the desired monocrystalline silicon layers upon the substrate. This is done by changing the gas mixture to hydrogen and silicon tetrachloride. Ultimately the finished semiconductor component is permitted to cool in a flow of hydrogen.

Instead of silicon as heating carrier for the substrate crystal hyperpure graphite and other materials, which may be silicized, and known for such purposes in the production of semiconductor devices by monocrystalline precipitation from the gaseous phase may be used.

Example 2

Producing pure surfaces of a substrate crystal of indium arsenide, melting temperature 946° C.

The evaporator 13 filled with arsenic chloride is maintained at 50° C. by means of a water bath (not shown) and the apparatus is rinsed with hydrogen. The substrate crystal 9 of the InAs is heated to a temperature of 800° C. by means of the high-frequency coil 11. Thereafter a gas mixture consisting of 1 mole hydrogen and 0.16 mole hydrogen chloride is passed through the evaporator and entrains 0.04 mole gaseous arsenic chloride ($AsCl_3$). This mixture constitutes the etching gas and enters into the etching cell onto the InAs substrate heated to 800° C. The etching is performed for 15 minutes. The etched surface is smooth and brilliant. Thereafter the desired monocrystalline InAs layers can be grown on the substrate in accordance with the known method.

A considerable advantage of the method according to the invention is the fact that disc-shaped substrate crystals can also be etched and provided with grown monocrystalline layers without using a heating support proper. This mode of the method will be described with reference to FIG. 2.

According to FIG. 2, a quartz tube 21 is provided with a holder 22 for a graphite plunger 23 joined with a rod 25 of semiconductor material whose upper portion is provided with lateral slots 26 in the manner described in the copending application Ser. No. 200,526, filed June 6, 1962 and now Patent No. 3,152,933. The assembly just described is located in a tubular quartz vessel according to FIG. 1 and surrounded by an induction-heater coil 24. The upper portion of the semiconductor rod 25, which may consist for example of silicon or a semiconductor compound such as indium arsenide, constitutes in effect a multiplicity of disc-shaped substrate crystals stacked on top of one another.

Example 3

Producing pure surfaces of several disc-shaped substrate crystals of silicon.

The heating of the rod 25 in apparatus according to FIG. 2 is effected in the same manner as described above with reference to Example 1. However, the upper, slotted portion of the rod is maintained at 1150 to 1250° C. by positioning the high-frequency coil 24 accordingly. The gas etching is then performed as described in Example 1. As a result, smooth and brilliant surfaces at the heated rod portion are obtained; all of the disc portions are eached on top and at the bottom. After the etching operation, the desired semiconductor devices can be produced by precipitating monocrystalline semiconductor material upon the slotted rod. This has the effect that uniform semiconductor layers are deposited upon both the top and bottom surface of each disc. Thereafter, the slotted rod is permitted to cool in a hydrogen flow. After removing the cooled rod from the vessel, the individual discs are completely severed from each other.

Each component of the etching gas performs an important function during the etching operation. The hydrogen component of the mixture serves as a carrier gas as well as for diluting the other components, particularly the hydrogen halide. However, the hydrogen also participates in the etching process which, for example with silicon and hydrogen chloride, takes place in accordance with the reversible reaction $$Si+4HCl \rightleftharpoons SiCl_4+2H_2$$

One might assume that it suffices to use hydrogen chloride alone for gas etching purposes. We have found, however, that hydrogen chloride alone or hydrogen chloride diluted with hydrogen does not result in smooth, brilliant surfaces. One rather obtains rough surfaces with many bits of larger or smaller depth. Such pitted surfaces are completely unsuitable as substrates for the precipitation of semiconductor material from the gaseous phase in monocrystalline constitution. However, if a small amount of a gaseous halogen compound of the particular semiconductor material, for example $SiCl_4$ is admixed to the mixture of hydrogen and hydrogen halide, then smooth and brilliant etched surfaces are obtained.

By varying the proportion of hydrogen halide or of the halogen compound of the semiconductor material in the etching gas, the rate of elimination can be changed within wide limits. This rate increases when increasing the proportion of hydrogen halide or reducing the proportion of the semiconductor halogen compound. Conversely, the rate of elimination is reduced by reducing the proportion of hydrogen halide or increasing the proportion of the semiconductor halogen compound. The rate at which material is eliminated from the substrate also depends upon the etching temperature. This affords the possibility of exactly adjusting the etching method according to the invention to a given etching problem.

Figure 3:
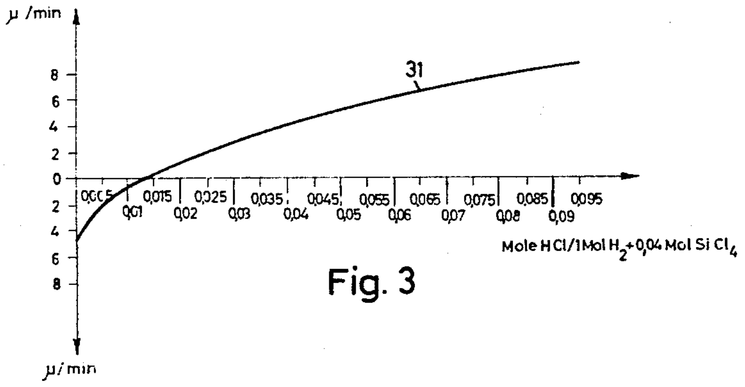
FIG. 3 is an explanatory graph representing the rate of elimination in dependence upon the hydrogen-chloride concentration in the reaction gas with reference to the processing of silicon.

The graph shown in FIG. 3 represents the rate of elimination of growth for substrate crystals of silicon with respect to the hydrogen-chloride concentration in a contant mixture of 1 mole hydrogen and 0.04 mole silicon tetrachloride at a temperature of 1150° C. The abscissa shows the molar hydrogen-chloride (HCl) concentration with reference to a mixture of 1 mole hydrogen and 0.04 mole silicon tetrachloride. The positive values on the ordinate shows the rate of elimination and the negative values show the rate of growth in microns per minute. The curve 31 represents the rate of elimination and growth. The rate of elimination decreases with decreasing hydrogen-chloride concentration and becomes zero at a concentration of 0.0125 mole HCl/(1 mole $H_2$+0.04 mole $SiCl_4$). With this gas composition, the reaction passes through a state in which it is ideally reversible. In this state, silicon is neither eliminated nor grown. By further reduction of the hydrogen-chloride concentration, a range is reached in which the reaction proceeds in the reverse direction so that silicon is grown on the substrate.

It will be understood from the foregoing that only the presence of the semiconductor halogen compound in the etching gas secures the desired, largely reversible course of the etching reaction which constitutes the prerequisite for the satisfactory, planar removal of the semiconductor material from the substrate surface. In the above-described examples, the semiconductor halogen compound is added to the mixture of hydrogen and hydrogen halide from a suitable container before the mixture enters into the etching cell. However, the method can also be performed by having the halogen compound of the semiconductor material formed during the course of the process by a reaction of the semiconductor material with the hydrogen halide contained in the mixture of hydrogen and hydrogen halide, so that the composition of the etching gas becomes completed only by virtue of this reaction. In the case of silicon, this involves the reaction $$Si+4HCl \text{ (dil. with } H_2)=SiCl_4+2H_2$$

Of course, the reaction conditions must be so chosen that the etching gas still contains a quantity of hydrogen halide sufficient for the subsequent etching operation.

The reaction resulting in the formation of the halogen compound of the semiconductor material can be performed either prior to entrance of the etching gas into the etching cell or also in the etching cell itself. The latter mode is particularly recommended for the etching of semiconductor materials which are arranged on a heatable support of the same semiconductor material. For example, silicon substrates which are placed upon the support consisting of silicon or of a heatable silicized material can be subjected at a temperature of about 1050 to 1350° C. to a flow of a gas mixture consisting of hydrogen and hydrogen chloride for a period of 1 to 60 minutes. Suitable as a heating support in this case is, for example, a silicon-coated panel of graphite.

We claim:

1. A method of producing pure surfaces of semiconductor bodies selected from silicon, germanium and $A^{III}B^{V}$ compounds, which comprises passing a gas mixture, consisting of hydrogen, hydrogen chloride and a chloride of the semiconductor material, over a semiconductor substrate body at a temperature of about 50 to 500° C. below its melting point for a period of 1 to 60 minutes, so that an etching reaction in the sense of a controllable elimination of the semiconductor surface together with a polishing takes place.

2. The method of producing pure planar silicon surfaces which comprises passing a gas mixture, consisting of 1 mole $H_2$, 0.16 mole HCl and 0.04 mole $SiCl_4$ over a silicon substrate at a temperature of 1150 to 1250° C. for a period of about three minutes.

3. The method of producing pure planar indium arsenide surfaces, which comprises passing a gas mixture consisting of 1 mole $H_2$, 0.16 mole HCl and 0.04 mole $AsCl_3$ over an indium arsenide substrate at a temperature of about 800° C. for about 15 minutes.

References Cited

UNITED STATES PATENTS

| | | | |
|---|---|---|---|
| 2,744,002 | 5/1956 | Seiler | 156—17 |
| 3,168,422 | 2/1965 | Allegretti et al. | 148—175 |
| 3,243,323 | 3/1966 | Corrigan et al. | 148—175 |

FOREIGN PATENTS

| | | |
|---|---|---|
| 720,601 | 11/1965 | Canada. |

JACOB H. STEINBERG, *Primary Examiner.*